(12) United States Patent
Kajiyama

(10) Patent No.: US 9,000,545 B2
(45) Date of Patent: Apr. 7, 2015

(54) MAGNETIC RANDOM ACCESS MEMORY

(75) Inventor: Takeshi Kajiyama, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 636 days.

(21) Appl. No.: 13/236,582

(22) Filed: Sep. 19, 2011

(65) Prior Publication Data

US 2012/0217594 A1 Aug. 30, 2012

(30) Foreign Application Priority Data

Feb. 28, 2011 (JP) ................................ 2011-042690

(51) Int. Cl.
*H01L 43/08* (2006.01)
*H01L 27/22* (2006.01)
*G11C 11/16* (2006.01)

(52) U.S. Cl.
CPC ............ *H01L 27/228* (2013.01); *G11C 11/161* (2013.01); *H01L 43/08* (2013.01); *G11C 11/1675* (2013.01)

(58) Field of Classification Search
CPC ................... H01L 43/08; G11C 11/02; G11C 11/14–11/16; G11C 11/161
USPC ........... 257/421, E43.001, E43.004; 365/158, 365/171, 173
See application file for complete search history.

(56) References Cited

U.S. PATENT DOCUMENTS

| | | |
|---|---|---|
| 2006/0054947 A1 | 3/2006 | Asao et al. |
| 2008/0206895 A1 | 8/2008 | Asao et al. |
| 2010/0032779 A1 | 2/2010 | Tsukamoto et al. |
| 2010/0102407 A1 | 4/2010 | Kajiyama et al. |
| 2010/0244163 A1* | 9/2010 | Daibou et al. ................ 257/421 |
| 2012/0012954 A1* | 1/2012 | Yamada et al. ............... 257/421 |
| 2013/0062714 A1* | 3/2013 | Zhu et al. ..................... 257/421 |

FOREIGN PATENT DOCUMENTS

| | | |
|---|---|---|
| JP | 2006-086195 | 3/2006 |
| JP | 2010-040928 | 2/2010 |
| JP | 2010-103303 | 5/2010 |
| WO | WO 2010026831 A1 * | 3/2010 |

* cited by examiner

*Primary Examiner* — Allison P Bernstein
(74) *Attorney, Agent, or Firm* — Knobbe, Martens, Olson & Bear, LLP

(57) ABSTRACT

A magnetic random access memory includes a semiconductor substrate, an MTJ element formed from a perpendicular magnetization film and arranged above the semiconductor substrate, and a stress film including at least one of a tensile stress film arranged on an upper side of the MTJ element to apply a stress in a tensile direction with respect to the semiconductor substrate and a compressive stress film arranged on a lower side of the MTJ element to apply a stress in a compressive direction with respect to the semiconductor substrate.

18 Claims, 8 Drawing Sheets

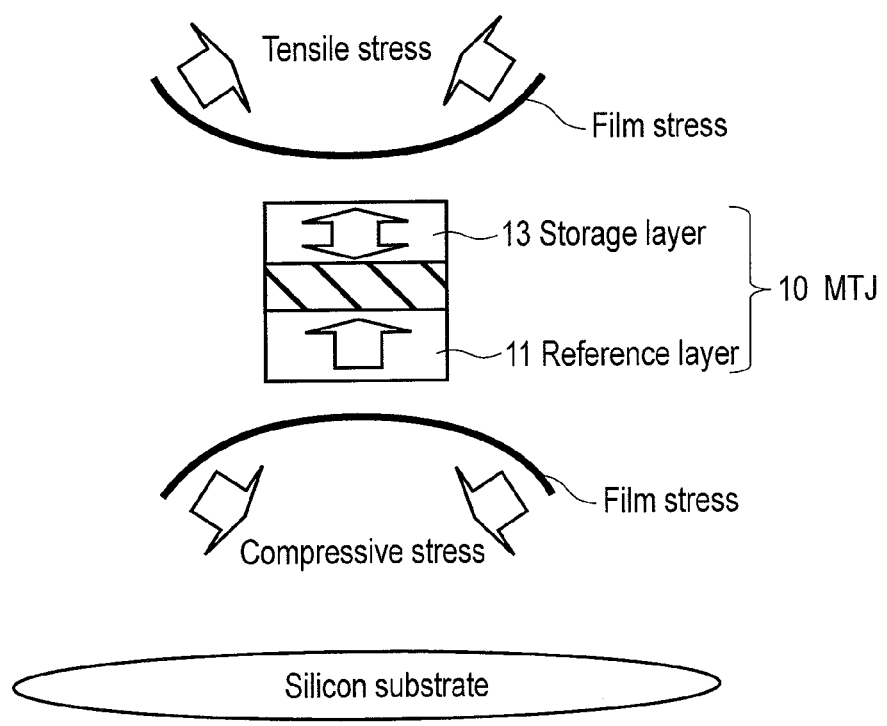
F I G. 2

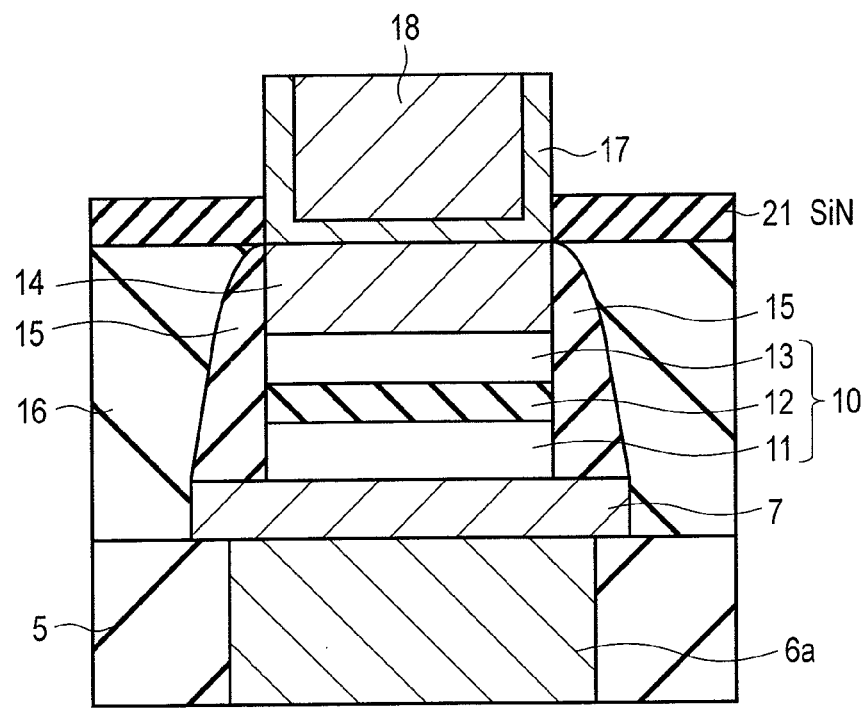
F I G. 3
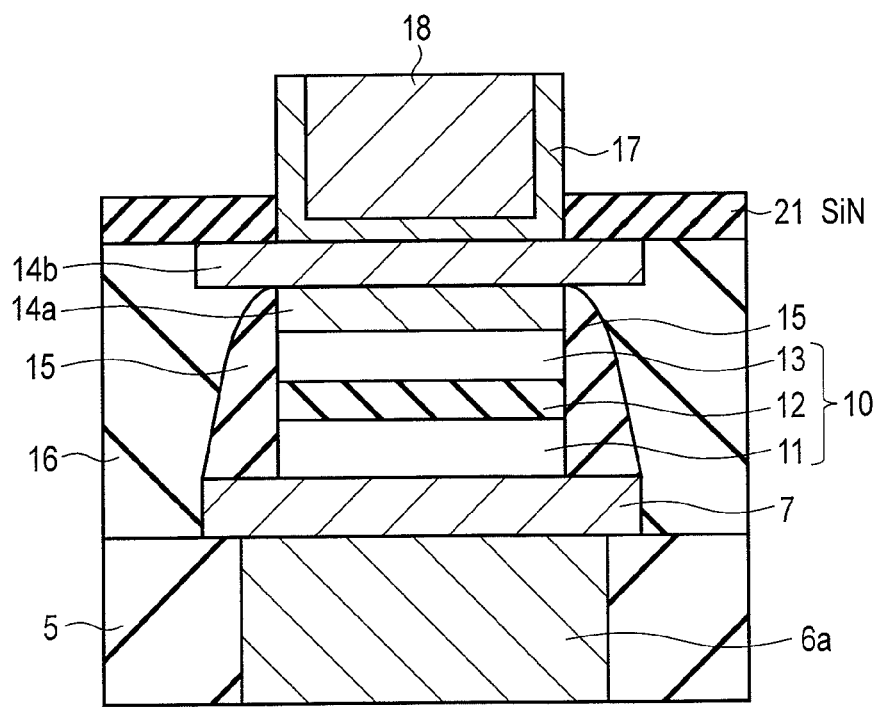
F I G. 4

MAGNETIC RANDOM ACCESS MEMORY

CROSS-REFERENCE TO RELATED APPLICATIONS

This application is based upon and claims the benefit of priority from prior Japanese Patent Application No. 2011-042690, filed Feb. 28, 2011, the entire contents of which are incorporated herein by reference.

FIELD

Embodiments described herein relate generally to a magnetic random access memory having a stress film.

BACKGROUND

In recent years, a magnetic random access memory (MRAM) has been expected as a nonvolatile RAM alternative to a DRAM+NOR flash memory. In the current magnetic random access memory, however, the MTJ (Magnetic Tunnel Junction) element serving as a memory element exhibits a weak anisotropy, a large inverted current value, and a low signal ratio (MR ratio), posing problems for commercialization.

BRIEF DESCRIPTION OF THE DRAWINGS

FIG. 2 is a view showing the concept of the embodiment;

FIG. 3 is a sectional view showing the structure around an MTJ element according to the first embodiment;

FIG. 4 is a sectional view showing the structure around another MTJ element according to the first embodiment;

DETAILED DESCRIPTION

Figure 1:
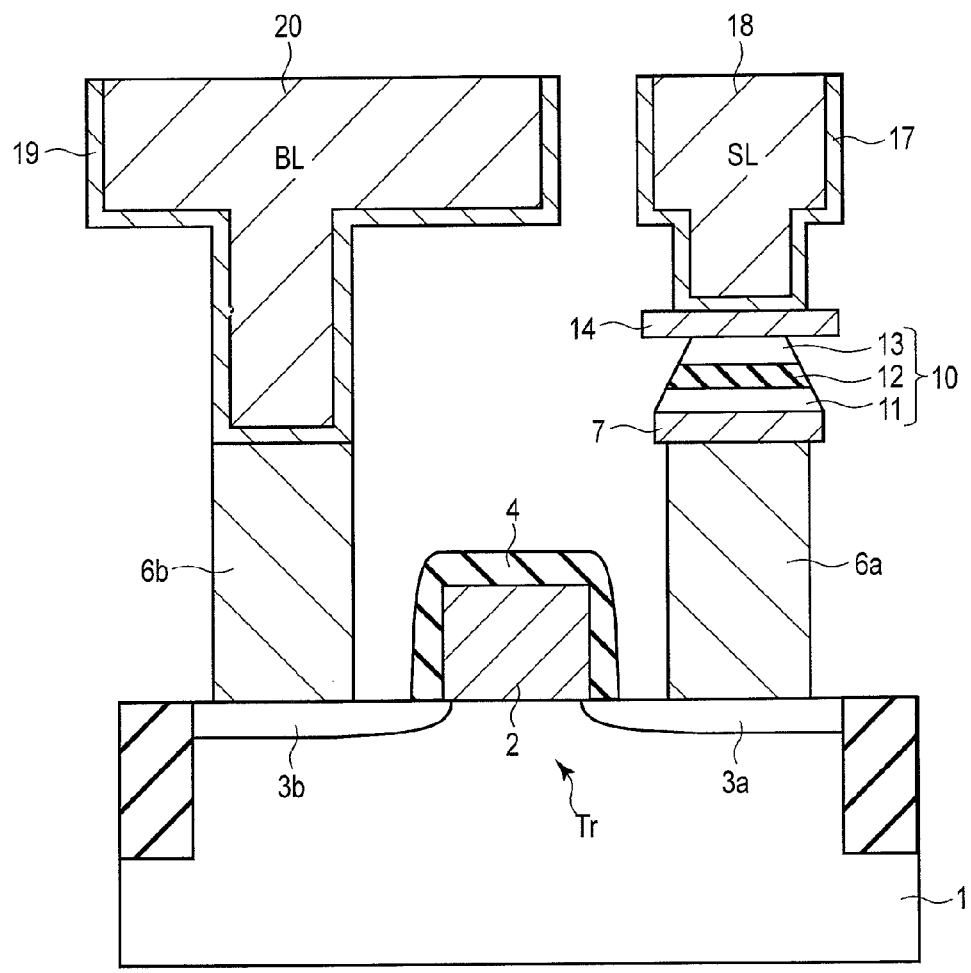
FIG. 1 is a schematic sectional view showing a memory cell of a spin transfer torque magnetic random access memory according to an embodiment.

In general, according to one embodiment, a magnetic random access memory includes a semiconductor substrate, an MTJ element formed from a perpendicular magnetization film and arranged above the semiconductor substrate, and a stress film including at least one of a tensile stress film arranged on an upper side of the MTJ element to apply a stress in a tensile direction with respect to the semiconductor substrate and a compressive stress film arranged on a lower side of the MTJ element to apply a stress in a compressive direction with respect to the semiconductor substrate.

An embodiment will now be described with reference to the accompanying drawings. In the following explanation, the same reference numerals denote the same parts throughout the drawings.

[1] Outline

The schematic arrangement of a memory cell of a spin transfer torque magnetic random access memory according to the embodiment will be described with reference to FIG. 1.

As shown in FIG. 1, the memory cell of the spin transfer torque magnetic random access memory has a 1 transistor+1 MTJ structure. More specifically, a gate electrode 2 is formed on a gate insulating film (not shown) on a semiconductor substrate 1. Source/drain diffusion layers 3a and 3b are formed in the semiconductor substrate 1 on both sides of the gate electrode 2. A transistor Tr is thus formed. An MTJ element 10 is connected to one source/drain diffusion layer 3a of the transistor Tr via a contact 6a and a lower electrode 7. The MTJ element 10 includes a reference layer 11, a storage layer 13, and a tunnel barrier layer 12 formed between the reference layer 11 and the storage layer 13. A source line (SL) 18 is connected onto the MTJ element 10 via an upper electrode 14 and a barrier metal film 17. A bit line (BL) 20 is connected to the other source/drain diffusion layer 3b of the transistor Tr via a contact 6b and a barrier metal film 19.

In the memory cell of the spin transfer torque magnetic random access memory, the direction of spin of the MTJ element 10 is controlled by currents from above and below the MTJ element 10. For this purpose, the source line 18 is connected to one terminal of the MTJ element 10, and the bit line 20 is connected to the other terminal of the MTJ element 10 via the transistor Tr.

The concept of the embodiment will be described next with reference to FIG. 2.

As shown in FIG. 2, a perpendicular magnetization film is used as the MTJ element 10. In FIG. 2, the silicon substrate is arranged on the lower side of the drawing. The reference layer 11 is arranged on the lower side of the MTJ element 10 (on the silicon substrate side). The storage layer 13 is arranged on the upper side of the MTJ element 10. In this example, magnetization of the reference layer 11 is directed upward, and the direction of magnetization of the storage layer 13 is rewritten upward or downward by a current.

Film stresses are shown on the upper and lower sides of the MTJ element 10 of the perpendicular magnetization type. The film stresses indicate directions advantageous for the magnetization characteristic of the MTJ element 10.

In the MTJ element 10 using the perpendicular magnetization film, both the reference layer 11 and the storage layer 13 have magnetization (spin) perpendicular to the substrate surface of the silicon substrate (the film surface of the MTJ film). Applying a membrane stress in a direction in which the direction of magnetization is readily retained in the normal state is advantageous for the coercive characteristic. Accurately directing each of the reference layer 11 and the storage layer 13 in the perpendicular direction leads to improvement of the read signal ratio (MR ratio) and reduction of the inverted current.

That is, the direction advantageous for the coercive characteristic is the direction in which the MTJ film is stretched in the perpendicular direction, as shown in FIG. 2. Hence, a stress film for applying a stress in the tensile direction with respect to the silicon substrate is arranged on the upper side of the MTJ element 10, whereas a stress film for applying a stress in the compressive direction with respect to the silicon substrate is arranged on the lower side of the MTJ element 10.

In this embodiment, the above-described stress films are arranged for the MTJ element 10, thereby improving the characteristics of the MTJ element 10 using the perpendicular magnetization film. Embodiments that embody the arrangement will be described below.

[2] First Embodiment

In the first embodiment, a stress film having a tensile stress with respect to a semiconductor substrate is arranged on the upper side of an MTJ element 10.

The structure around the MTJ element 10 according to the first embodiment will be described with reference to FIG. 3.

As shown in FIG. 3, a lower electrode 7 connected to a contact 6a is formed on the contact 6a and an interlayer insulation film 5. The MTJ element 10 is formed on the lower electrode 7. An upper electrode 14 is formed on the MTJ element 10. The upper electrode 14 may be the hard mask used when processing the MTJ element 10. The planar shape of the upper electrode 14 can be the same as that of the MTJ element 10. The side surfaces of the upper electrode 14 can match those of the MTJ element 10. A sidewall insulating film 15 is formed on the side surfaces of the MTJ element 10 and the upper electrode 14. The outer edge of the button surface of the sidewall insulating film 15 matches, for example, the side surfaces of the lower electrode 7. A source line 18 is formed on a barrier metal film 17 on the upper electrode 14.

In the first embodiment, a silicon nitride (SiN) film 21 is formed on the upper side of the MTJ element 10. The silicon nitride film 21 is formed to cover the upper electrode 14 (MTJ element 10) and an interlayer insulation film 16. After that, when forming the source line 18, the silicon nitride film 21 on the upper electrode 14 is removed. The silicon nitride film 21 thus exists on the interlayer insulation film 16 buried around the MTJ element 10 while surrounding the lower portion of the source line 18.

The silicon nitride film 21 also serves as the stress film of the transistor. To make the silicon nitride film 21 function as the tensile stress film, SiN preferably has an SiN density of 3 g/cm$^3$ or more and an N—H amount of 5×10$^{21}$ atms/cm$^3$ or more.

However, the silicon nitride film 21 can function as the tensile stress film depending on the method of forming it without having these numerical values.

Note that the upper electrode 14 on the MTJ element 10 may have a two-layered structure including a first upper electrode 14a and a second upper electrode 14b, as shown in FIG. 4. In FIG. 4, the second upper electrode 14b is formed on the first upper electrode 14a as in FIG. 3. The second upper electrode 14b can have the same planar shape as that of the lower electrode 7 and side surfaces matching those of the lower electrode 7. In FIG. 4 the silicon nitride film 21 exists on the interlayer insulation film 16 and the second upper electrode 14b.

In FIGS. 3 and 4, the single tensile stress film (silicon nitride film 21) is formed on the upper side of the MTJ element 10. However, a plurality of tensile stress films may be provided. For example, the tensile stress films may be formed around the multilayer interconnections existing above the MTJ element 10. In this case, the tensile stress films can also function as a stopper when processing the interconnection material (for example, Cu).

According to the first embodiment, the silicon nitride film 21 functioning as the tensile stress film is formed above and near the MTJ element 10. The silicon nitride film 21 applies, to the MTJ element 10, a stress in the tensile direction with respect to the semiconductor substrate. Hence, the stress acts in the direction of magnetization of the MTJ element 10 and in the direction to help the anisotropy, thereby improving the perpendicular magnetization characteristic. As a result, it is possible to improve the spin coercive characteristic of the MTJ element 10, improve the anisotropy, increase the signal ratio, and decrease the inverted current value.

[3] Second Embodiment

In the second embodiment, a stress film having a compressive stress with respect to a semiconductor substrate is arranged on the lower side of an MTJ element 10. In the second embodiment, points different from the first embodiment will mainly be explained.

The structure around the MTJ element 10 according to the second embodiment will be described with reference to FIG. 5.

Figure 5:
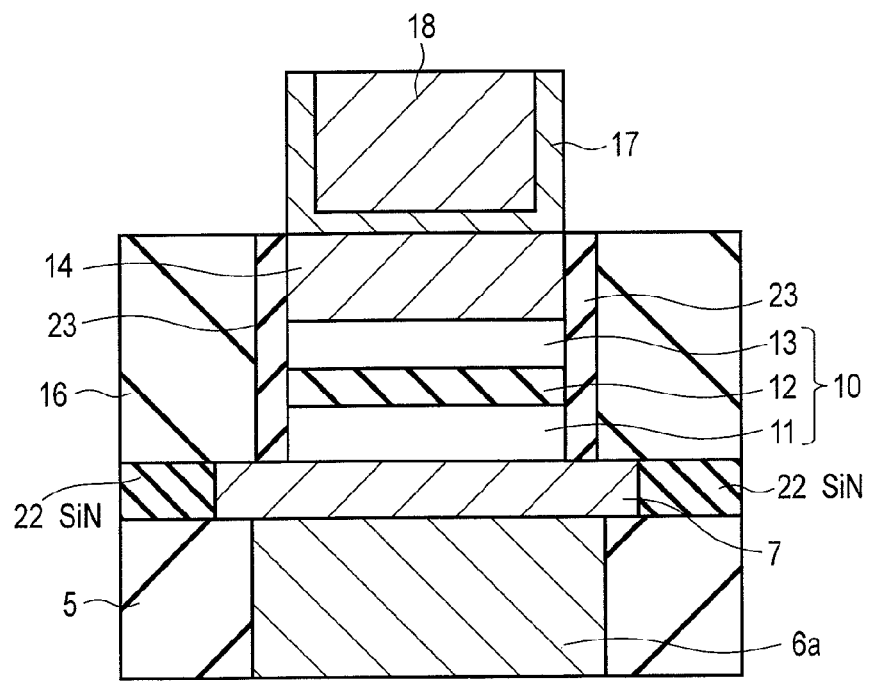
FIG. 5 is a sectional view showing the structure around an MTJ element according to the second embodiment.

As shown in FIG. 5, the second embodiment is different from the first embodiment in that a silicon nitride film 22 functioning as a compressive stress film is arranged on the lower side of the MTJ element 10.

The silicon nitride film 22 is formed on an interlayer insulation film 5 around a lower electrode 7. The silicon nitride film 22 can have a film thickness equal to or different from that of the lower electrode 7. To make the silicon nitride film 22 function as the compressive stress film, SiN preferably has an SiN density of 3 g/cm$^3$ or less and an N—H amount of 5×10$^{21}$ atms/cm$^3$ or less. However, the silicon nitride film 22 can function as the compressive stress film depending on the method of forming it without having these numerical values. In addition, a silicon nitride film having an SiN density of 3 g/cm$^3$ and an N—H amount of 5×10$^{21}$ atms/cm$^3$ can function as both the tensile stress film and the compressive stress film. The functions can selectively be used depending on the film formation conditions and the like.

Figure 6:
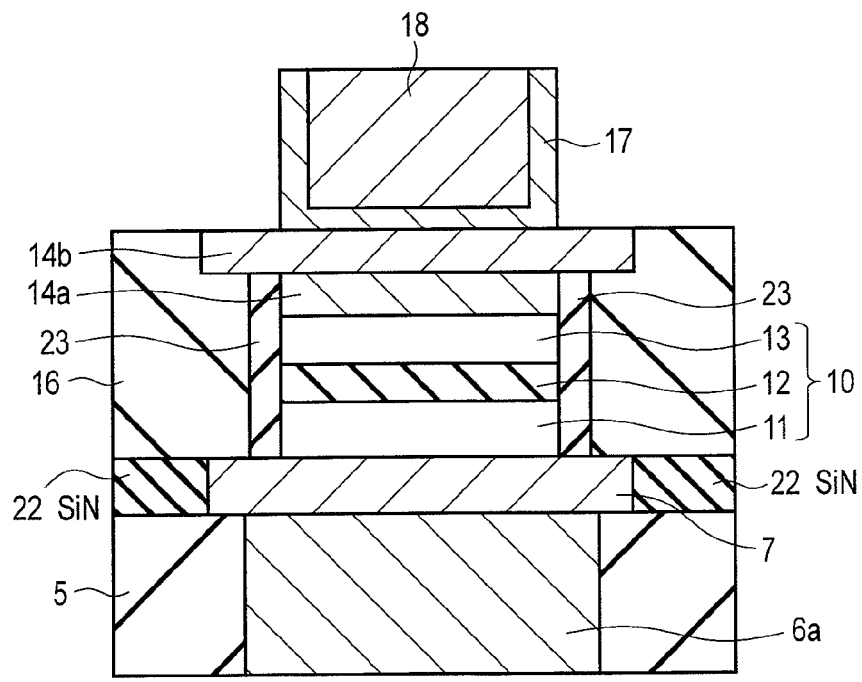
FIG. 6 is a sectional view showing the structure around another MTJ element according to the second embodiment.

Note that an upper electrode 14 on the MTJ element 10 may have a two-layered structure including a first upper electrode 14a and a second upper electrode 14b, as shown in FIG. 6. In this case, the second upper electrode 14b can have the same planar shape as that of the lower electrode 7 and side surfaces matching those of the lower electrode 7.

In the second embodiment shown in FIGS. 5 and 6, an oxide film 23 is formed on the side surfaces of the MTJ element 10 and the upper electrode 14. The oxide film 23 is, for example, a metal oxide film formed when processing the MTJ element 10 and the like. However, in the second embodiment, the oxide film 23 need not always exist. In place of the oxide film 23, a sidewall insulating film 15 as in the first embodiment may be formed on the side surfaces of the MTJ element 10 and the upper electrode 14.

According to the second embodiment, the silicon nitride film 22 functioning as the compressive stress film is formed on the lower side of the MTJ element 10.

The silicon nitride film 22 applies, to the MTJ element 10, a stress in the compressive direction with respect to the semiconductor substrate, thereby improving the perpendicular magnetization characteristic of the MTJ element 10. As a result, it is possible to improve the spin coercive characteristic of the MTJ element 10, increase the signal ratio, and decrease the inverted current value.

[4] Third Embodiment

In the third embodiment, a stress film having a tensile stress with respect to a semiconductor substrate is arranged on the side surfaces of an upper electrode 14 located on the upper side of an MTJ element 10. In the third embodiment, points different from the first embodiment will mainly be explained.

The structure around the MTJ element 10 according to the third embodiment will be described with reference to FIG. 7.

Figure 7:
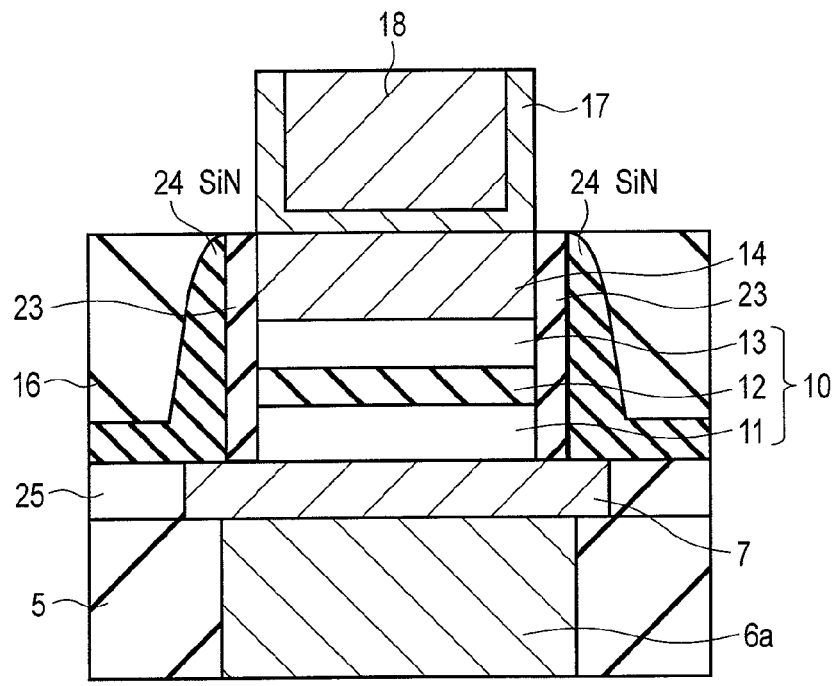
FIG. 7 is a sectional view showing the structure around an MTJ element according to the third embodiment.

As shown in FIG. 7, the third embodiment is different from the first embodiment in that a silicon nitride film 24 functioning as a stress film is arranged on an oxide film 23 on the side surfaces of the MTJ element 10 and the upper electrode 14.

The silicon nitride film 24 is formed on a portion corresponding to the upper portion of the MTJ element 10 (that is, on the side surfaces of the upper electrode 14), and functions as a tensile stress film. That is, SiN of the silicon nitride film 24 preferably has an SiN density of 3 g/cm$^3$ or more and an N—H amount of $5 \times 10^{21}$ atms/cm$^3$ or more.

The silicon nitride film 24 illustrated is formed not only on the side surfaces of the MTJ element 10 and the upper electrode 14 but also on an interlayer insulation film 25 and a lower electrode 7. However, the silicon nitride film need only be formed at least on the side surfaces of the upper electrode 14.

Figure 8:
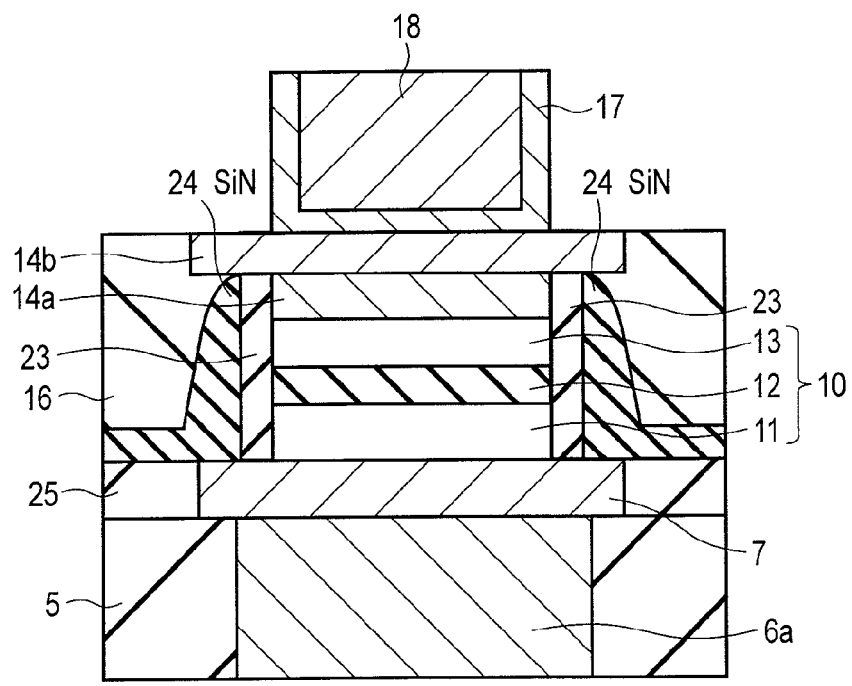
FIG. 8 is a sectional view showing the structure around another MTJ element according to the third embodiment.

Note that the upper electrode 14 on the MTJ element 10 may have a two-layered structure including a first upper electrode 14a and a second upper electrode 14b, as shown in FIG. 8. In FIG. 8, the silicon nitride film 24 need only be formed at least on the side surfaces of the first upper electrode 14a.

In the third embodiment shown in FIGS. 7 and 8, the oxide film 23 is formed on the side surfaces of the MTJ element 10 and the upper electrode 14. However, the oxide film 23 need not always exist, and the silicon nitride film 24 may be formed directly on the side surfaces of the MTJ element 10 and the upper electrode 14. In place of the oxide film 23, a sidewall insulating film 15 as in the first embodiment may be formed on the side surfaces of the MTJ element 10 and the upper electrode 14.

According to the third embodiment, the silicon nitride film 24 functioning as the tensile stress film is formed on the side surfaces of the upper electrode 14 (first upper electrode 14a) of the upper side of the MTJ element 10. For this reason, the same effects as in the first embodiment can be obtained. In addition, since the silicon nitride film 24 functioning as the tensile stress film is closer to the MTJ element 10 as compared to the first embodiment, the effects can be enhanced.

[5] Fourth Embodiment

The fourth embodiment is a modification of the third embodiment. An end portion of a silicon nitride film 26 on the upper side of an MTJ element 10 is arranged in direct contact with the side surfaces of an upper electrode 14. In the fourth embodiment, points different from the third embodiment will mainly be explained.

The structure around the MTJ element 10 according to the fourth embodiment will be described with reference to FIG. 9.

Figure 9:
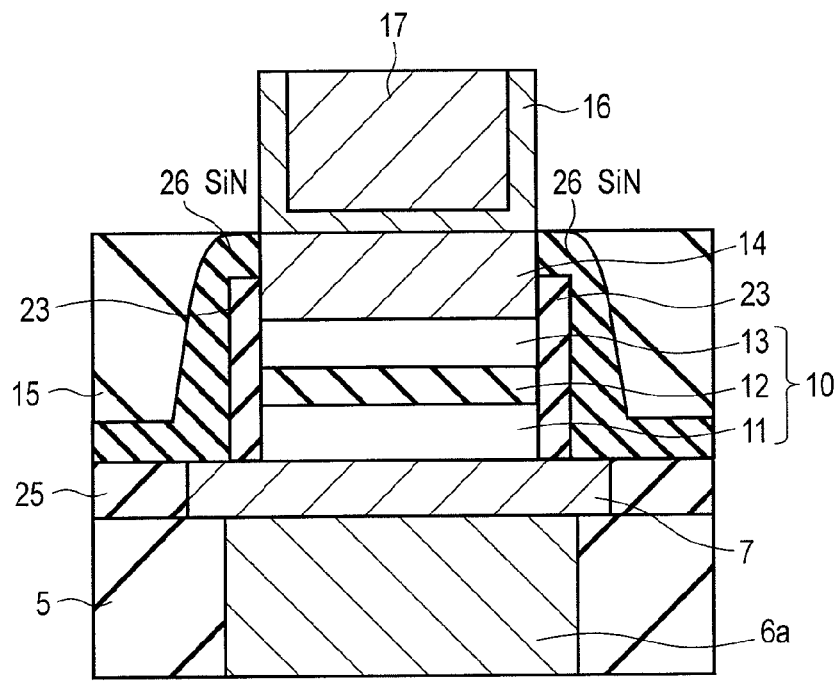
FIG. 9 is a sectional view showing the structure around an MTJ element according to the fourth embodiment.

As shown in FIG. 9, the fourth embodiment is different from the third embodiment in that the silicon nitride film 26 functioning as a tensile stress film is formed such that its end portion is in direct contact with the side surfaces of the upper electrode 14.

More specifically, in the fourth embodiment, an oxide film 23 is formed on the side surfaces of the MTJ element 10 and the upper electrode 14 so as to expose at least part of the side surfaces of the upper electrode 14. Referring to FIG. 9, the oxide film 23 does not exist on the upper portion of the side surfaces of the upper electrode 14, and the silicon nitride film 26 is formed at this portion. Hence, the end portion of the silicon nitride film 26 in contact with the side surfaces of the upper electrode 14 is located on the upper side of the MTJ element 10.

Figure 10:
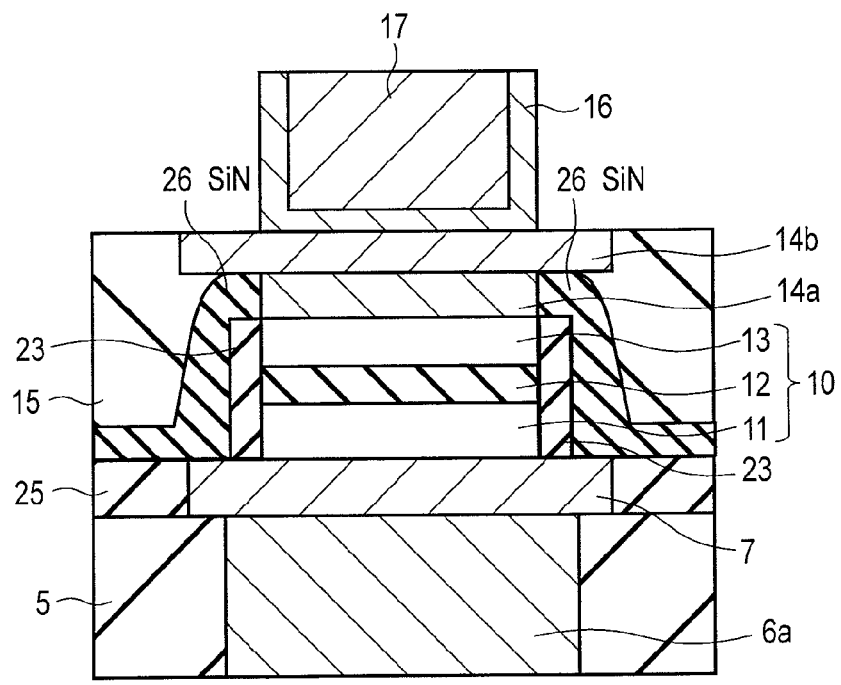
FIG. 10 is a sectional view showing the structure around another MTJ element according to the fourth embodiment.

Note that the upper electrode 14 on the MTJ element 10 may have a two-layered structure including a first upper electrode 14a and a second upper electrode 14b, as shown in FIG. 10. In FIG. 10, the end portion of the silicon nitride film 26 is in contact with the side surfaces of the first upper electrode 14a.

According to the fourth embodiment, the same effects as in the third embodiment can be obtained. In the fourth embodiment, the end portion of the silicon nitride film 26 functioning as the tensile stress film is in contact with the side surfaces of the upper electrode 14 (first upper electrode 14a) on the upper side of the MTJ element 10. Even when the oxide film 23 is formed on the side surfaces of the MTJ element 10 and the upper electrode 14, the starting point where the tensile stress is applied is closer to the MTJ element 10. For this reason, the tensile stress is efficiently applied to the MTJ element 10 to further improve the perpendicular magnetization characteristic of the MTJ element 10.

[6] Fifth Embodiment

In the fifth embodiment, Ta (tantalum) having a compressive stress with respect to a semiconductor substrate is used for a lower electrode 27 on the lower side of an MTJ element 10, whereas W (tungsten) having a tensile stress with respect to the semiconductor substrate is used for an upper electrode 28 on the upper side of the MTJ element 10. In the fifth embodiment, points different from the first embodiment will mainly be explained.

The structure around the MTJ element 10 according to the fifth embodiment will be described with reference to FIG. 11.

Figure 11:
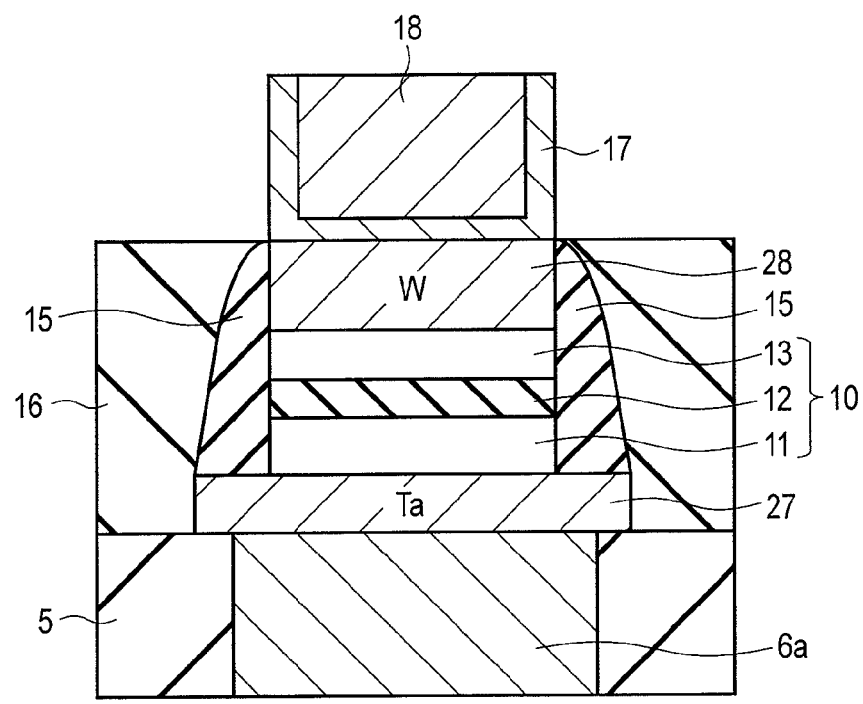
FIG. 11 is a sectional view showing the structure around an MTJ element according to the fifth embodiment.

In the fifth embodiment, the stress characteristic of a material is used, as shown in FIG. 11, instead of providing the silicon nitride film 21, as in the first embodiment. That is, the Ta film that applies a compressive stress with respect to the substrate is used for the lower electrode 27 on the lower side of the MTJ element 10. The W film that applies a tensile stress with respect to the substrate is used for the upper electrode 28 on the upper side of the MTJ element 10. Hence, in this embodiment, the lower electrode 27 functions as a compressive stress film, and the upper electrode 28 functions as a tensile stress film.

Figure 12:
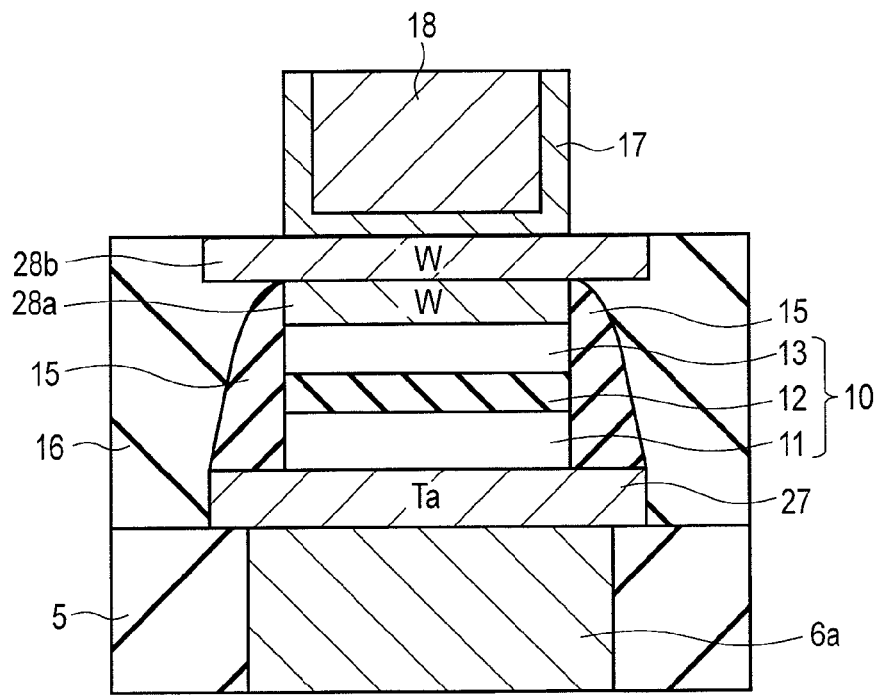
FIG. 12 is a sectional view showing the structure around another MTJ element according to the fifth embodiment.

Note that the upper electrode 28 on the MTJ element 10 may have a two-layered structure including a first upper electrode 28a and a second upper electrode 28b, as shown in FIG. 12. In this case, at least one of the first upper electrode 28a and the second upper electrode 28b is made of W. When forming only one of the first upper electrode 28a and the second upper electrode 28b by W, the first upper electrode 28a closer to the MTJ element 10 is made of W.

In this embodiment, it is preferable to satisfy both using Ta for the lower electrode 27 and using W for the upper electrode 28. However, one of them may be satisfied.

According to the fifth embodiment, Ta having a compressive stress is used for the lower electrode 27 on the lower side of the MTJ element 10, and W having a tensile stress is used for the upper electrode 28 on the upper side of the MTJ element 10. For this reason, the lower electrode 27 can apply a compressive stress to the MTJ element 10, and the upper electrode 28 can apply a tensile stress. Applying the stress above and below the MTJ element 10 enables to improve the perpendicular magnetization characteristic of the MTJ element 10. As a result, it is possible to improve the coercive characteristic of the MTJ element 10, increase the signal ratio, and decrease the inverted current value.

[7] Sixth Embodiment

The sixth embodiment is a modification of the fifth embodiment. A TaOx film 29 is arranged around a lower electrode 27. In the sixth embodiment, points different from the fifth embodiment will mainly be explained.

The structure around an MTJ element 10 according to the sixth embodiment will be described with reference to FIG. 13.

Figure 13:
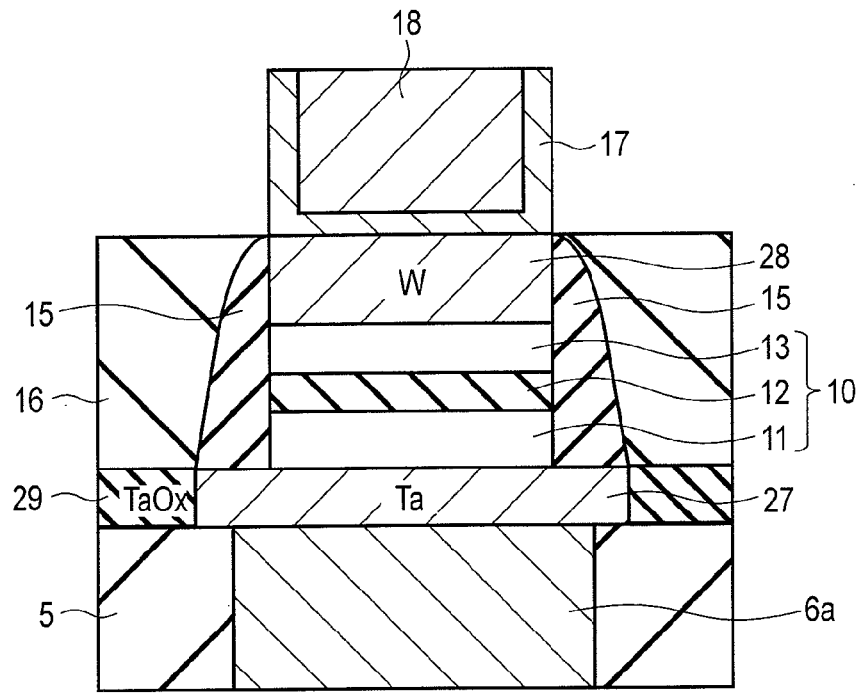
FIG. 13 is a sectional view showing the structure around an MTJ element according to the sixth embodiment.

As shown in FIG. 13, the sixth embodiment is different from the fifth embodiment in that the TaOx film 29 is arranged around the lower electrode 27 made of Ta.

The TaOx film 29 has a compressive stress stronger than that of the Ta film. In addition, the TaOx film 29 has insulating properties and therefore never causes a short circuit between the MTJ elements 10 even when formed on the entire surface around the lower electrode 27. The TaOx film 29 can have a film thickness equal to or different from that of the lower electrode 27.

Figure 14:
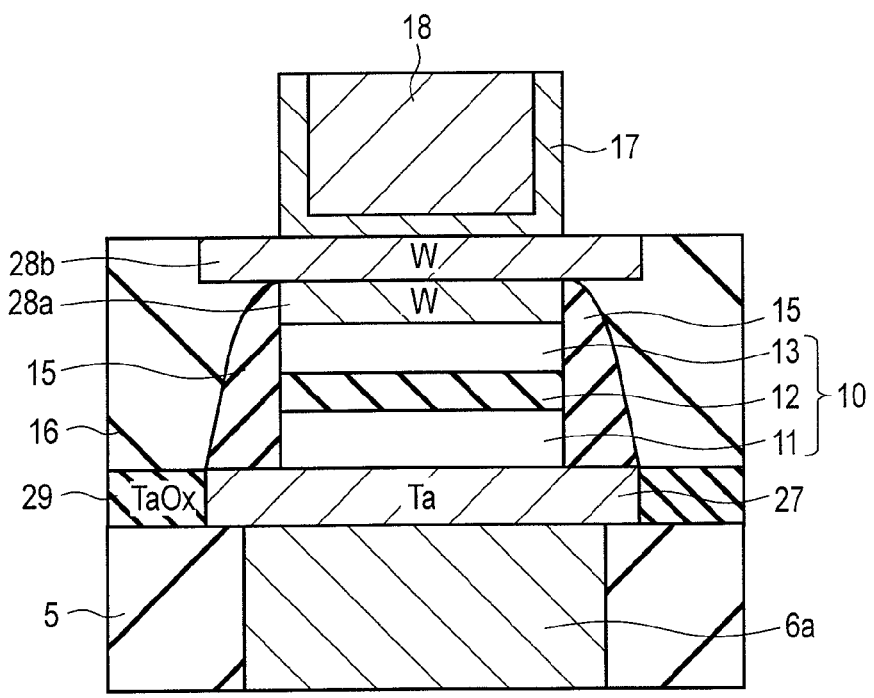
FIG. 14 is a sectional view showing the structure around another MTJ element according to the sixth embodiment.

Note that an upper electrode 28 on the MTJ element 10 may have a two-layered structure including a first upper electrode 28a and a second upper electrode 28b, as shown in FIG. 14.

According to the sixth embodiment, the TaOx film 29 is arranged around the lower electrode 27 made of Ta. For this reason, the compressive stress film exists on the entire surface on the lower side of the MTJ element 10. This allows to enhance the compressive stress from below the MTJ element 10 and further improve the perpendicular magnetization characteristic of the MTJ element 10.

[8] Others

In the first to sixth embodiments, the MTJ film is stacked such that the reference layer 11 is located at the lower side (substrate side) of the MTJ element 10. However, the MTJ element 10 may be inverted such that the reference layer 11 is located on the upper side of the MTJ element 10.

The perpendicular magnetization characteristic of the MTJ element 10 can be improved by arranging the tensile stress film and the compressive stress film of the first to sixth embodiments not on the side of the reference layer 11 but on the side of the storage layer 13. That is, when the storage layer 13 is located on the upper side of the MTJ element 10, the tensile stress film is formed on the upper side of the MTJ element 10. When the storage layer 13 is located on the lower side of the MTJ element 10, the compressive stress film is formed on the lower side of the MTJ element 10.

In the first to sixth embodiments, the stresses can be enhanced by, for example, increasing the film thickness or area of the tensile stress film and the compressive stress film.

Two or more of the first to sixth embodiments may variously be combined.

In the first to sixth embodiments, the sizes and shapes of the contact 6a, the lower electrode 7, the MTJ element 10, the upper electrode 14, the sidewall insulating film 15, the source line 18, and the like are merely examples and can be changed variously.

As described above, according to the magnetic random access memory of the first to sixth embodiments described above, a stress film that advantageously acts on the magnetization of the MTJ element 10 is arranged on at least one of the upper and lower sides of the MTJ element 10, thereby improving the coercive characteristic of the MTJ element 10.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic random access memory comprising:
    a semiconductor substrate;
    an MTJ element formed from a perpendicular magnetization film and arranged above the semiconductor substrate; and
    a stress film including a tensile stress film arranged on at least one of an upper side of the MTJ element and a lower side of the MTJ element to apply a stress in a tensile direction with respect to the semiconductor substrate.

2. The memory according to claim 1, wherein
    the tensile stress film includes an upper electrode formed on the MTJ element and connected to the MTJ element,
    the compressive stress film includes a lower electrode formed under the MTJ element and connected to the MTJ element, and
    at least one of forming the upper electrode by W and forming the lower electrode by Ta is satisfied.

3. The memory according to claim 2, wherein the compressive stress film further comprises a TaOx film formed around the lower electrode.

4. The memory according to claim 1, further comprising an upper electrode formed on the MTJ element and connected to the MTJ element,
    wherein the tensile stress film is formed on a side surface of the upper electrode.

5. The memory according to claim 4, further comprising an oxide film formed on a side surface of the MTJ element,
    wherein the tensile stress film is formed on a side surface of the oxide film, and
    an end portion of the tensile stress film is in contact with the side surface of the upper electrode.

6. The memory according to claim 1, further comprising an interlayer insulation film buried around the MTJ element,
    wherein the tensile stress film is formed on the interlayer insulation film.

7. The memory according to claim 1, wherein the tensile stress film comprises a silicon nitride film.

8. The memory according to claim 1, wherein the tensile stress film comprises a silicon nitride film having an SiN density of not less than 3 $g/cm^3$ and an N—H amount of not less than $5 \times 10^{21}$ $atms/cm^3$.

9. The memory according to claim 1, wherein
    the MTJ element includes a reference layer, a storage layer, and a tunnel barrier layer formed between the reference layer and the storage layer, and
    the tensile stress film and the compressive stress film are arranged at least on a side of the storage layer.

10. The memory according to claim 1, wherein the stress in the tensile direction is applied to a storage layer among the at least two perpendicular magnetization films.

11. The memory according to claim 1, wherein only the stress in the tensile direction is applied to an upper film among the at least two perpendicular magnetization films.

12. The memory according to claim 11, wherein the upper film is a storage layer.

13. The memory according to claim 1, further comprising a compressive stress film arranged on the lower side of the MTJ element to apply a stress in a compressive direction with respect to the semiconductor substrate when the tensile stress film is arranged on the upper side of the MTJ element and when the tensile stress film is not arranged on the lower side of the MTJ element.

14. The memory according to claim 13, further comprising a lower electrode formed under the MTJ element and connected to the MTJ element, wherein the compressive stress film is formed around the lower electrode.

15. The memory according to claim 13, wherein the compressive stress film comprises a silicon nitride film.

16. The memory according to claim 13, wherein the compressive stress film comprises a silicon nitride film having an SiN density of not more than 3 g/cm$^3$ and an N—H amount of not more than 5×10$^{21}$ atms/cm$^3$.

17. The memory according to claim 13, wherein only the stress in the compressive direction is applied to a lower film among the at least two perpendicular magnetization films.

18. The memory according to claim 17, wherein the lower film is a reference layer.

* * * * *